(12) United States Patent
Kinder

(10) Patent No.: US 10,164,621 B2
(45) Date of Patent: *Dec. 25, 2018

(54) CIRCUIT AND METHOD OF OPERATING CIRCUIT

(71) Applicant: TAIWAN SEMICONDUCTOR MANUFACTURING COMPANY, LTD., Hsinchu (TW)

(72) Inventor: Russell Kinder, Austin, TX (US)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 15/646,309

(22) Filed: Jul. 11, 2017

(65) Prior Publication Data

US 2017/0310311 A1 Oct. 26, 2017

Related U.S. Application Data

(63) Continuation of application No. 14/986,885, filed on Jan. 4, 2016, now Pat. No. 9,735,764, which is a
(Continued)

(51) Int. Cl.
*H03K 3/00* (2006.01)
*H03K 5/13* (2014.01)
(Continued)

(52) U.S. Cl.
CPC ............ *H03K 5/13* (2013.01); *H03K 5/131* (2013.01); *H03K 5/159* (2013.01); *H03K 17/687* (2013.01);
(Continued)

(58) Field of Classification Search
CPC combination set(s) only.
See application file for complete search history.

(56) References Cited

U.S. PATENT DOCUMENTS 6,774,674 B2 * 8/2004 Okamoto ............. H03K 17/063
326/27
7,205,821 B2 4/2007 Rutter
(Continued)

FOREIGN PATENT DOCUMENTS

CN 1717869 1/2006

OTHER PUBLICATIONS

Mappus, Steve, "Predicitve Gate Drive Boosts Synchronous DC/DC Power Converter Efficiency", Texas Instruments, Application Report, SLUA281—Apr. 2003, pp. 1-26.
(Continued)

*Primary Examiner* — An Luu
(74) *Attorney, Agent, or Firm* — Hauptman Ham, LLP

(57) ABSTRACT

A circuit includes a first switch, a second switch, a first delay circuit and a second delay circuit. The first switch includes a first terminal, and the second switch includes a second terminal. The first circuit is coupled to the first terminal and the second terminal. The first circuit is configured to alternately turn ON the first switch and the second switch in accordance with an input signal and a delay setting. The delay setting corresponds to a delay between successive ON times of the first switch and the second switch. The second circuit is coupled to the first circuit. The second circuit is configured to monitor a first voltage on the first terminal and a second voltage on the second terminal, and to generate the delay setting based on at least the first voltage on the first terminal, or the second voltage on the second terminal.

20 Claims, 11 Drawing Sheets

Related U.S. Application Data continuation of application No. 14/291,388, filed on May 30, 2014, now Pat. No. 9,231,573.

(51) Int. Cl.
   *H03K 5/131* (2014.01)
   *H03K 5/159* (2006.01)
   *H03K 17/687* (2006.01)
   *H03K 5/00* (2006.01)

(52) U.S. Cl.
   CPC ............ *H03K 2005/00019* (2013.01); *H03K 2005/00058* (2013.01); *H03K 2005/00195* (2013.01)

(56) References Cited

U.S. PATENT DOCUMENTS

| | | |
|---|---|---|
| 7,839,667 B2 | 11/2010 | Liao et al. |
| 7,990,215 B2 | 8/2011 | Soenen |
| 8,120,401 B2 | 2/2012 | Kenly et al. |
| 8,384,365 B2 | 2/2013 | Maksimovic et al. |
| 8,493,121 B1 | 7/2013 | Ramaraju |
| 8,508,207 B2 | 8/2013 | Burns et al. |
| 8,525,559 B2 | 9/2013 | Horng |
| 8,710,873 B2 | 4/2014 | Barrenscheen et al. |
| 9,231,573 B2 | 1/2016 | Kinder |
| 2010/0321101 A1 | 12/2010 | Hu et al. |

OTHER PUBLICATIONS

Jia-Ming Liu et al., "A Current-Mode DC-DC Buck Converter with Efficiency-Optimized Frequency Control and Reconfigurable Compensation", IEEE Transactions on Power Electronics, vol. 27, No. 2, Feb. 2012, pp. 869-880.

Raymond F. Foley et al., "An Area Efficient Digital Pulsewidth Modulation Architecture Suitable for FPGA Implementation", 2005 IEEE, pp. 1412-1418.

Raymond Foley et al., "Multiphase Digital Pulsewidth Modulator", IEEE Transactions on Power Electronics, vol. 21, No. 3, May 2006, pp. 842-846.

Bo-Ting Yeh et al., "Sensorless Dead-Time Exploration for Digitally Controlled Switching Converters", 2013 IEEE, 4 pages.

Ting Lu et al., "Design of Voltage Balancing Control Circuit for Series Connected HV-IGBTs", 2013 International Conference on Electrical Machines and Systems, Oct. 26-29, 2013, Busan, Korea, pp. 515-518.

Hangseok Choi, "Flyback Converter Protection Scheme with a Selective Shutdown Delay Time", 2006 IEEE, pp. 2192-2196.

Office Action dated Jul. 20, 2016 from corresponding No. TW 104115997.

Office Action dated Oct. 9, 2017 from corresponding application No. CN 201410386780.8.

\* cited by examiner

CIRCUIT AND METHOD OF OPERATING CIRCUIT

PRIORITY CLAIM

The present application is a continuation of U.S. application Ser. No. 14/986,885, filed Jan. 4, 2016, now U.S. Pat. No. 9,735,764, issued Aug. 15, 2017, which is a continuation of U.S. application Ser. No. 14/291,388, filed May 30, 2014, now U.S. Pat. No. 9,231,573, issued Jan. 5, 2016, which are incorporated herein by reference in their entireties.

BACKGROUND

Driving circuits including two serially connected switches are used in a number of applications. In such a driving circuit, a situation where both of the serially connected switches are turned ON, or shoot-through, is a concern due to potential power loss, increased operational temperature and/or possible failure. For shoot-through prevention purposes, a break-before-make delay is inserted between successive ON times of the switches to ensure one switch is turned OFF before the other switch is turned ON. Such a delay presents further concerns, because an excessive delay potentially reduces efficiency whereas an insufficient delay potentially permits shoot-through.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
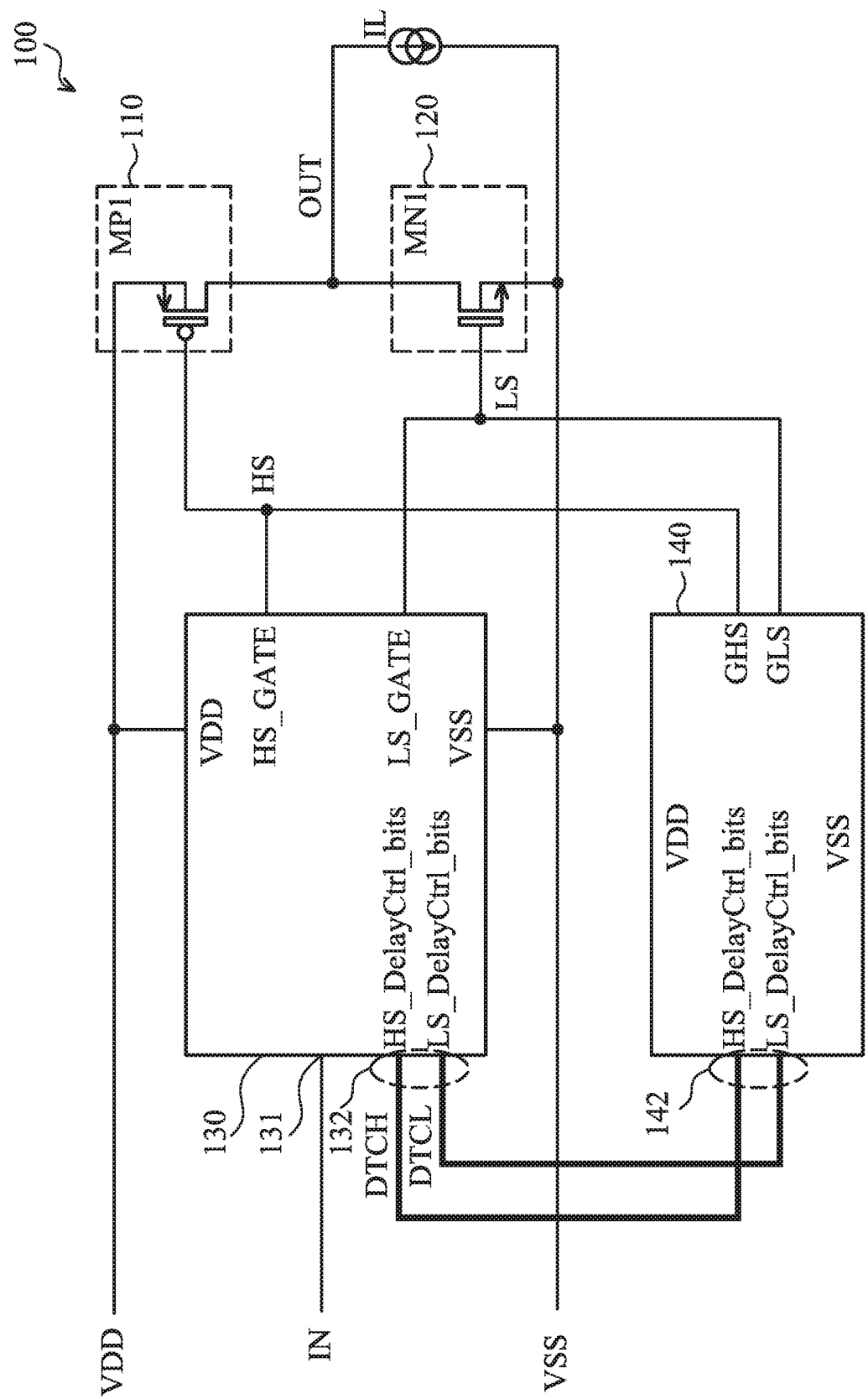
FIG. 1A is a schematic circuit diagram of a driving circuit in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, when a first element is described as being "connected" or "coupled" to a second element, such a description includes embodiments in which the first and second elements are directly connected or coupled to each other, and also includes embodiments in which the first and second elements are indirectly connected or coupled to each other with one or more other intervening elements in between. In the following description, a node or line and a corresponding signal on the node or line are commonly referred to using the node name. For example, VDD is used interchangeably herein to denote both a power supply voltage node and a power supply voltage on the node.

FIG. 1A is a schematic circuit diagram of a driving circuit 100 in accordance with some embodiments. The driving circuit 100 comprises a first switch 110, a second switch 120, a delay generating circuit 130 and a delay controlling circuit 140.

The first switch 110 and the second switch 120 are coupled in series between a first supply voltage node VDD (referred to herein as "VDD") and a second supply voltage node VSS (referred to herein as "VSS"). The first switch 110 includes a first control terminal HS, and the second switch 120 includes a second control terminal LS. An output node OUT is arranged between the first switch 110 and the second switch 120. A load IL is coupled to the output node OUT. The first switch 110 is turned ON in response to a first voltage (referred to herein as "GHS") on the first control terminal HS, to pull the output node OUT to VDD. The first switch 110 is a pull-up device and also referred to as the high side driver or high side switch. The second switch 120 is turned ON in response to a second voltage (referred to herein as "GLS") on the second control terminal LS, to pull the output node OUT to VSS. The second switch 120 is a pull-down device and also referred to as the low side driver or low side switch. In the specific configuration of FIG. 1A, the first switch 110 includes a p-channel metal-oxide semiconductor (PMOS) transistor MP1 and the second switch 120 includes a n-channel metal-oxide semiconductor (NMOS) transistor MN1. Other switch configurations and/or transistor types are within the scope of various embodiments.

The delay generating circuit 130 has a first input 131 configured to receive an input signal IN, a second input 132 configured to receive a delay setting from the delay controlling circuit 140, a first output HS_GATE coupled to the first control terminal HS, and a second output LS_GATE coupled to the second control terminal LS. In at least one embodiment, the input signal IN is supplied by a pulse-width modulation circuit. Other circuits for supplying the input signal IN are within the scope of various embodiments.

Figure 1B:
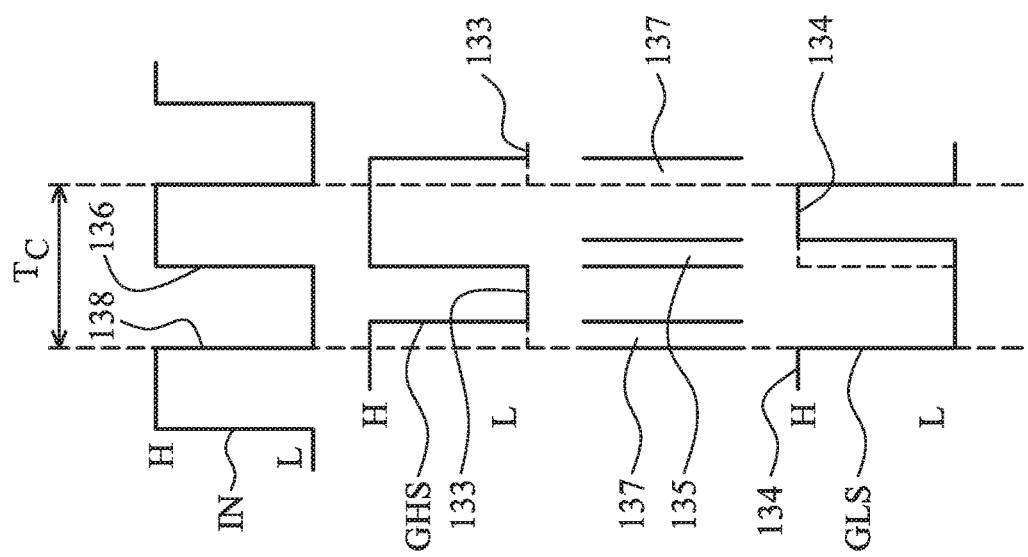
FIG. 1B is a timing diagram of an operation of a circuit in a driving circuit in accordance with some embodiments.

FIG. 1B is a timing diagram of an operation of the delay generating circuit 130 in accordance with some embodiments. The delay controlling circuit 140 is configured to output the first voltage GHS to the first control terminal HS via the output HS_GATE and to output the second voltage GLS to the second control terminal LS via the output LS_GATE for alternately turning ON the first switch 110 and the second switch 120 in accordance with the input signal IN. For example, in a cycle Tc, when the input signal IN is low (i.e., at a low level L), the first voltage GHS is low and turns ON the transistor MP1 in the first switch 110, whereas the second voltage GLS is low and turns OFF the transistor MN1 in the second switch 120. When the input signal IN is high (i.e., at a high level H), the first voltage GHS is high and turns OFF the transistor MP1 in the first switch 110, whereas the second voltage GLS is high and turns ON the transistor MN1 in the second switch 120. The ON time of the first switch 110 when the first switch 110 is turned ON is indicated as 133, and the ON time of the second switch 120 when the second switch 120 is turned ON is indicated as 134 in FIG. 1B. When the ON time 133 of the first switch 110 and the ON time 134 of the second switch 120 overlap in time, both of the first switch 110 and the second switch 120 are turned ON and a shoot-through occurs.

For shoot-through prevention purposes, a delay is inserted between successive ON times of the first switch 110 and the second switch 120. For example, the delay generating circuit 130 is configured to insert a delay 135 between the ON time of the first switch 110 and the successive ON time of the second switch 120. The delay 135 delays the high level H (i.e., the ON time 134) of the second voltage GLS with respect to a transition 136 of the input signal IN from the low level L to the high level H. The delay generating circuit 130 is further configured to insert a delay 137 between the ON time of the second switch 120 and the successive ON time of the first switch 110. The delay 137 delays the low level L (i.e., the ON time 133) of the first voltage GHS with respect to a transition 138 of the input signal IN from the high level H to the low level L. The delays 135, 137 are referred to as dead-times. The longer the dead-times, the lower the efficiency of the driving circuit 100. The shorter the dead-times, the higher the likelihood of shoot-through. The dead-times, or the delays 135, 137, are generated by the delay generating circuit 130 in accordance with one or more delay settings supplied by the delay controlling circuit 140 via the second input 132. In the specific configuration of FIG. 1A, the delay settings received at the second input 132 include a plurality of bits HS_DelayCtrl_bits for controlling the length of the delay 137 of the ON time 133 of the first switch 110, and a plurality of bits LS_DelayCtrl_bits for controlling the length of the delay 135 of the ON time 134 of the second switch 120. Other arrangements are within the scope of various embodiments. For example, in at least one embodiment, a common delay setting is provided by the delay controlling circuit 140 to the delay generating circuit 130 to control both the delays 135, 137. An example configuration of the delay generating circuit 130 is described with respect to FIG. 6A-6B.

The delay controlling circuit 140 has a first input GHS coupled to the first control terminal HS to receive the first voltage GHS, and a second input GLS coupled to the second control terminal LS to receive the second voltage GLS. The delay controlling circuit 140 further has an output 142 coupled to the second input 132 of the delay generating circuit 130 to supply delay settings HS_DelayCtrl_bits and LS_DelayCtrl_bits for the corresponding delays 137, 135 to the second input 132 of the delay generating circuit 130. The delay controlling circuit 140 is configured to store the delay settings of the delays 135, 137. The delay controlling circuit 140 is further configured to control the delay generating circuit 130 to generate the delays 135, 137 in accordance with the stored delay setting, the first voltage GHS and the second voltage GLS.

In some embodiments, the delay controlling circuit 140 is configured to monitor the first voltage GHS and the second voltage GLS for a shoot-through condition and a dead-time condition. A shoot-through condition corresponds to an overlap of the ON times of the first switch 110 and the second switch 120. In normal operation, a shoot-through condition is prevented by the insertion of the delays 135, 137. However, due to one or more factors, such as insufficient lengths of the delays 135, 137, process/voltage/temperature (PVT) variations, circuit transient conditions and the like factors, a shoot-through condition potentially occurs. Upon detection of a shoot-through condition, the delay controlling circuit 140 adjusts at least one of the delay settings of the delays 135, 137 to increase the corresponding delay(s), until the shoot-through condition is no longer detected by the delay controlling circuit 140.

A dead-time condition corresponds to the presence (or detection) of the delay 135 or the delay 137 with a length (or duration) greater than an optimal value. In at least one embodiment, the optimal value depends on a particular application or specification of the driving circuit 100, and is determined by a specific circuitry configuration and/or sensitivity of the delay controlling circuit 140. For example, when the delay 135 or the delay 137 has a length sufficiently large to be detectable by the delay controlling circuit 140, the delay controlling circuit 140 determines that a dead-time condition is present. When the delay 135 and the delay 137 have lengths sufficiently small to be undetectable by the delay controlling circuit 140 (even though the delay 135 and the delay 137 still exist to prevent shoot-through), the delay controlling circuit 140 determines that a dead-time condition is absent. Upon detection of a dead-time condition, the delay controlling circuit 140 adjusts at least one of the delay settings of the delays 135, 137 to decrease the corresponding delay(s), until the dead-time condition is no longer detected by the delay controlling circuit 140.

Upon detection of no dead-time condition and no shoot-through condition, the delay controlling circuit 140 determines that the delays 135, 137 are optimal and keeps the delay settings of the delays 135, 137 unchanged. In at least one embodiment, the delay controlling circuit 140 does not adjust the achieved optimal delay settings unless and until a dead-time condition or a shoot-through condition is detected.

In at least one embodiment, the adjustability of the delay setting of the delay controlling circuit 140 provides one or more effects compared to other approaches with a fixed delay between successive ON time of the first and second switches. For example, in the other approaches with a fixed delay, there is no capability for changing the delay to compensate for PVT variations and/or variations due to circuitry aging and/or the like factors. As a result, the other approaches potentially suffer from excessive dead-time and decreased efficiency when a large fixed delay is selected, or from increased shoot-through probability when a small fixed delay is selected. The delay setting adjustability of the delay controlling circuit 140 in accordance with some embodiments avoids one or more of the discussed potential issues, by increasing the delay when a shoot-through condition is present and decreasing the delay when a dead-time condition is present.

In at least one embodiment, the storage of the delay setting in the delay controlling circuit 140 provides one or more effects compared to other approaches with an adaptive delay between successive ON time of the first and second switches. For example, in the other approaches with an adaptive delay, a delay setting is not stored. Instead, the delay is determined on a cycle-by-cycle basis, utilizing a feedback loop to delay the turning ON signal of one of the switches until the other switch is verified to be turned OFF. In high speed applications, the delay of such a feedback loop becomes potentially excessive which results in excessive dead-time. An additional, potential issue includes power loss. The delay setting storage in the delay controlling circuit 140 in accordance with some embodiments avoids one or more of the discussed potential issues, by omitting such a feedback loop.

In at least one embodiment, the feature of keeping the optimal delay setting unchanged in the delay controlling circuit 140 provides one or more effects compared to other approaches with a dynamic delay between successive ON time of the first and second switches. For example, in the other approaches with a dynamic delay, the delay is decreased from cycle to cycle until a shoot-through occurs, then the delay is increased from cycle to cycle until an excessive dead-time is detected, and then the process repeats. As a result, the delay is changed every cycle. Compared to the other approaches with the described dynamically varying delay, the delay controlling circuit 140 in at least one embodiment provides higher stability, with the delay rarely changed once the optimal dead-time signal has been achieved.

As illustrated in FIG. 1A, the delay controlling circuit 140, in accordance with some embodiments, is free of direct electrical connection to the output node OUT between the first switch 110 and the second switch 120. In at least one embodiment, the delay controlling circuit 140 is free of direct electrical connection to any external circuitry connected to the output node OUT from the load side of the driving circuit 100, and the delay controlling circuit 140 is not exposed to signals, variations, and/or transients from the output node OUT and/or from external circuitry on the load side of the driving circuit 100. As a result, the sensing accuracy and/or speed and/or bandwidth of the delay controlling circuit 140 in detecting shoot-through condition and/or dead-time condition is/are increased. The improvement in sensing accuracy and/or speed and/or bandwidth of the delay controlling circuit 140 in one or more embodiments over other approaches where the dead-time detecting circuitry is coupled to the output node OUT or external circuitry on the load side is especially noticeable in situations where charged device model (CDM) clamps and/or other electrostatic discharge (ESD) devices are coupled to the output node OUT. In one or more embodiments, the delay controlling circuit 140 is configured to operate with the driving circuit 100 at a switching frequency of the first and second switches of at least 100 MHz. In at least one embodiment, the delay controlling circuit 140 is configured to operate with the driving circuit 100 at a switching frequency of the first and second switches of 200 MHz.

Besides improved sensing accuracy and/or speed and/or bandwidth, the delay controlling circuit 140 in one or more embodiments with no direct electrical connection to the output node OUT and/or external circuitry on the load side of the driving circuit 100 provides one or more further effects. For example, the delay controlling circuit 140 in at least one embodiment is not susceptible to ringing associated with an inductor coupled to the output node OUT and/or other anomalies on the output node OUT. Further, compared to other approaches where the dead-time detecting circuitry is coupled to the output node OUT, the operation of the delay controlling circuit 140 in at least one embodiment does not depend on the direction current at the output node OUT, which results in higher sensing accuracy and/or a wider range of applications. In some embodiments, the delay controlling circuit 140 is operable with driving circuits configured as D-class amplifiers, push-pull regulators, buck converters. Other types of driving circuit are within the scope of various embodiments.

Figure 2A:
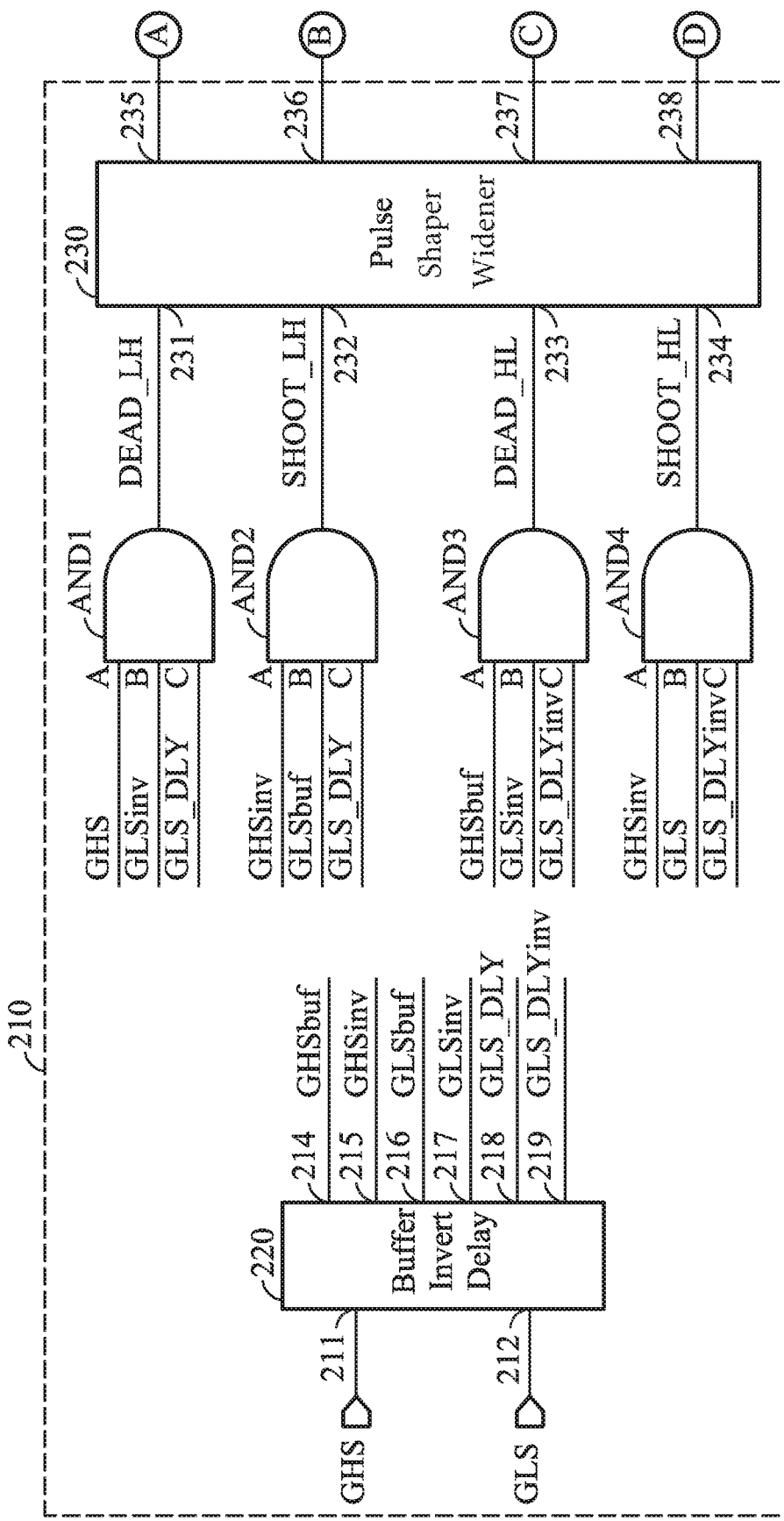
FIG. 2A-2B is a schematic diagram of a delay controlling circuit in accordance with some embodiments.
Figure 2B:
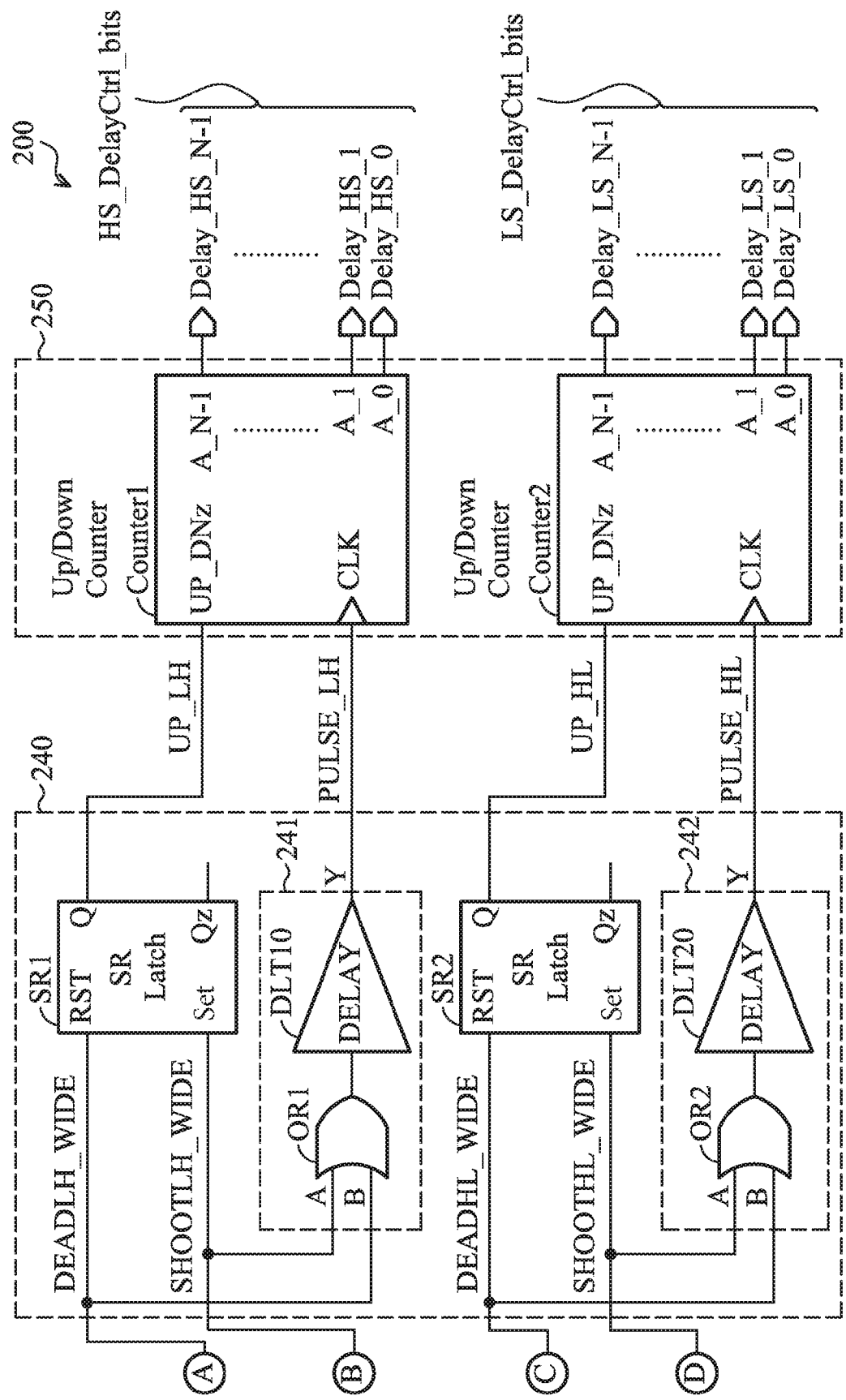

FIG. 2A-2B is a schematic diagram of a delay controlling circuit 200 in accordance with some embodiments. In at least one embodiment, the delay controlling circuit 200 corresponds to the delay controlling circuit 140 in the driving circuit 100 described with respect to FIG. 1A. The delay controlling circuit 200 comprises a signal pre-processing circuit 210, a delay adjustment determining circuit 240, and a delay storing and adjusting circuit 250.

The signal pre-processing circuit 210 is configured to receive the first voltage GHS and the second voltage GLS, and to generate from the first voltage GHS and the second voltage GLS a first dead-time signal DEADLH_WIDE, a first shoot-through signal SHOOTLH_WIDE, a second dead-time signal DEADHL_WIDE, and a second shoot-through signal SHOOTHL_WIDE. The first dead-time signal DEADLH_WIDE corresponds to a dead-time condition of the first switch 110 and the second switch 120 upon a low-to-high transition from the second switch (i.e., the low side driver) to the first switch 110 (i.e., the high side driver). In the time diagram of FIG. 1B, the first dead-time signal DEADLH_WIDE corresponds to the delay 137 at the transition 138 of the input signal IN. The first shoot-through signal SHOOTLH_WIDE corresponds to a shoot-through condition of the first switch 110 and the second switch 120 upon the low-to-high transition from the second switch 120 to the first switch 110. The second dead-time signal DEADHL_WIDE corresponds to a dead-time condition of the first switch 110 and the second switch 120 upon a high-to-low transition from the first switch 110 (i.e., the high side driver) to the second switch 120 (i.e., the low side driver). In the time diagram of FIG. 1B, the second dead-time signal DEADHL_WIDE corresponds to the delay 135 at the transition 136 of the input signal IN. The second shoot-through signal SHOOTHL_WIDE corresponds to a shoot-through condition of the first switch 110 and the second switch 120 upon the high-to-low transition from the first switch 110 to the second switch 120. The first dead-time signal DEADLH_WIDE, the first shoot-through signal SHOOTLH_WIDE, the second dead-time signal DEADHL_WIDE, and the second shoot-through signal SHOOTHL_WIDE are inputted to the delay adjustment determining circuit 240 for a determination whether the delay settings stored in the delay storing and adjusting circuit 250 is to be adjusted.

An example configuration of the signal pre-processing circuit 210 for generating the first dead-time signal DEADLH_WIDE, the first shoot-through signal SHOOTLH_WIDE, the second dead-time signal DEADHL_WIDE, and the second shoot-through signal SHOOTHL_WIDE from the first voltage GHS and the second voltage GLS is shown in FIG. 2A-2B. Other configurations of the signal pre-processing circuit 210 are within the scope of various embodiments.

The signal pre-processing circuit 210 includes a buffer-invert-delay circuit 220, four AND gates AND1-AND4, and a pulse sharper-widener circuit 230. The signal pre-processing circuit 210 further includes a first input 211 coupled to the first control terminal HS (in FIG. 1A) to receive the first voltage GHS, and a second input 212 coupled to the second control terminal LS (in FIG. 1A) to receive the second voltage GLS. The first input 211 and second input 212 are also inputs of the buffer-invert-delay circuit 220 in FIG. 2A-2B. The buffer-invert-delay circuit 220 has outputs 214-

219 configured to output corresponding signals GHSbuf, GHSinv, GLSbuf, GLSinv, GLS_DLY and GLS_DLYinv. The signals GHSbuf, GHSinv, GLSbuf, GLSinv, GLS_DLY and GLS_DLYinv are described with respect to FIG. 3.

Figure 3:
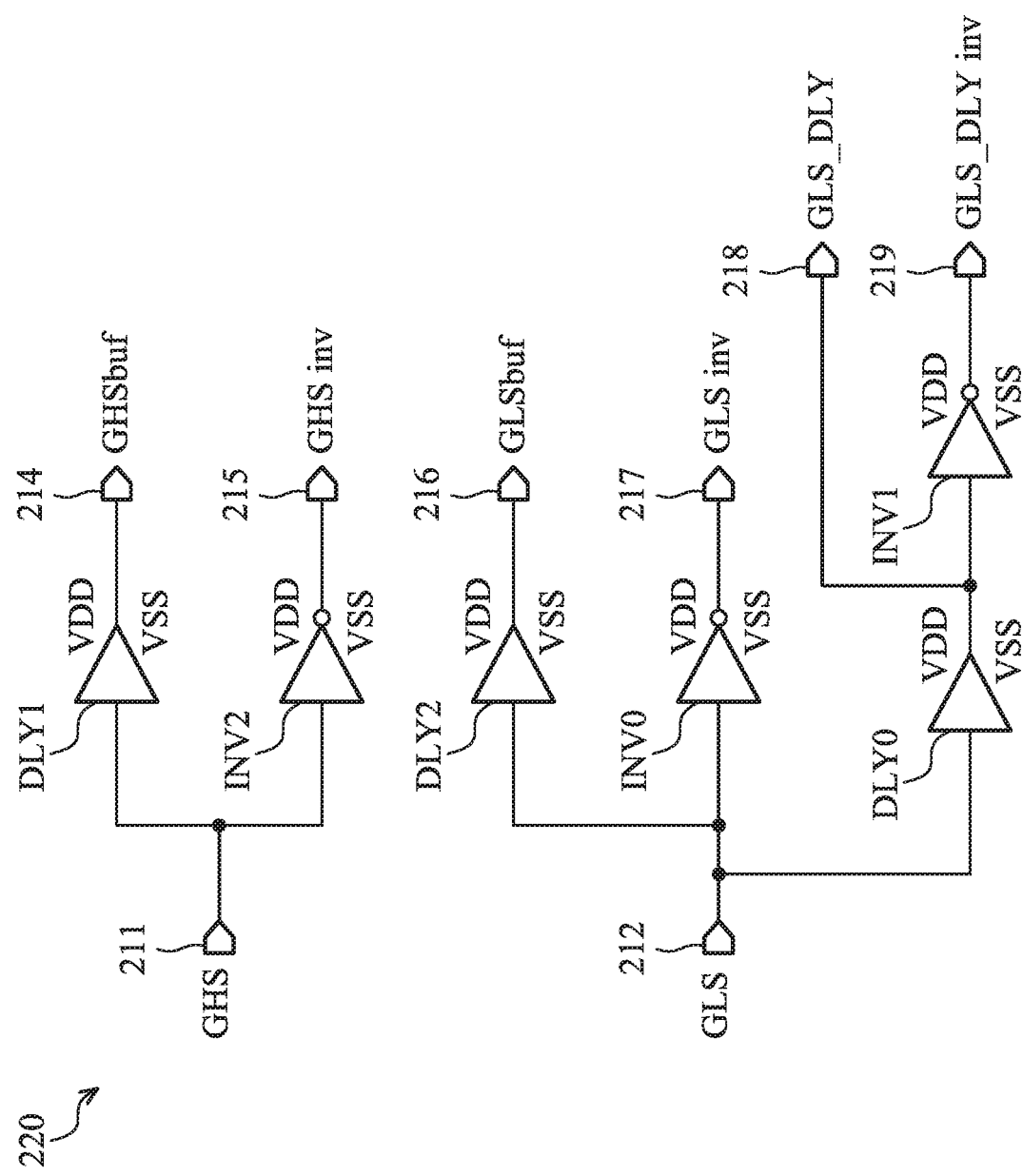
FIG. 3 is a schematic circuit diagram of a circuit in a delay controlling circuit in accordance with some embodiments.

FIG. 3 is a schematic circuit diagram of the buffer-invert-delay circuit 220 in accordance with some embodiments. The buffer-invert-delay circuit 220 includes a first non-inverting buffer DLY1, a first inverter INV2, a second non-inverting buffer DLY2, a second inverter INV0, a third non-inverting buffer DLY0, and a third inverter INV1. The first non-inverting buffer DLY1 includes an input coupled to the first input 211 of the signal pre-processing circuit 220, and an output coupled to the output 214 and configured to output the signal GHSbuf which is a buffered signal of the first voltage GHS. The first inverter INV2 includes an input coupled to the first input 211, and an output coupled to the output 215 and configured to output the signal GHSinv which is an inverted signal of the first voltage GHS. The second non-inverting buffer DLY2 includes an input coupled to the second input 212 of the signal pre-processing circuit, and an output coupled to the output 216 and configured to output the signal GLSbuf which is a buffered signal of the second voltage GLS. The second inverter INV0 includes an input coupled to the second input 212, and an output coupled to the output 217 and configured to output the signal GLSinv which is an inverted signal of the second voltage GLS. The third non-inverting buffer DLY0 includes an input coupled to the second input 212, and an output coupled to the output 218 and configured to output the signal GLS_DLY which is a delayed signal of the second voltage GLS. The third inverter INTV1 includes an input coupled to the output of the third non-inverting buffer DLY0, and an output coupled to the output 219 and configured to output the signal GLS_DLYinv which is an inverted signal of the signal GLS_DLY.

In at least one embodiment, the signals GHSbuf, GHSinv, GLSbuf, and GLSinv are generated with minimal delays from the corresponding first voltage GHS and second voltage GLS, for optimal processing speed. In at least one embodiment, the delays of the signals GHSbuf, GHSinv, GLSbuf, GLSinv are selected to be sufficient for signal transition at the subsequent logic circuit, e.g., the gates AND1-AND4, into which the signals GHSbuf, GHSinv, GLSbuf, GLSinv are inputted. For example, the delays of the signals GHSbuf, GHSinv, GLSbuf, GLSinv from the corresponding first voltage GHS and second voltage GLS are 100-200 ps (pico second) in one or more embodiments. In at least one embodiment, the edges of one or more of the signals GHSbuf, GHSinv, GLSbuf, GLSinv, GLS_DLY and GLS_DLY are sharpened by the corresponding buffers or inverters.

The signals GLS_DLY and GLS_DLY are generated to record the previous state of the second voltage GLS and the second switch 120. This information indicates the current transition in the driving circuit 100. For example, a high level (or logic "1") of the signal GLS_DLY indicates that the previous state of the second voltage GLS was high, which means that the second switch 120 was ON and is being turned OFF, which, in turn, means that the current transition is a low-to-high transition (i.e., from the low side driver to the high side driver). A low level (or logic "0") of the signal GLS_DLY indicates that the previous state of the second voltage GLS was low, which means that the second switch 120 was OFF and is being turned ON, which, in turn, means that the current transition is a high-to-low transition (i.e., from the high side driver to the low side driver). In at least one embodiment, the delays of the signals GLS_DLY and GLS_DLY are sufficiently large to keep the previous state of the second voltage GLS until the corresponding pulses of the signals GHSbuf, GHSinv, GLSbuf, GLSinv are completed. The described configuration of the buffer-invert-delay circuit 220 is an example. Other configurations for the buffer-invert-delay circuit 220 are within the scope of various embodiments.

Returning to FIG. 2A-2B, the gate AND1 has a first input A coupled to the first input 211 of the signal pre-processing circuit 210 to receive the first voltage GHS, a second input B coupled to the output 215 of the buffer-invert-delay circuit 220 to receive the signal GLSinv, a third input C coupled to the output 218 of the buffer-invert-delay circuit 220 to receive the signal GLS_DLY, and an output configured to output a signal DEAD_LH. When the signal GLS_DLY is high, indicating that the current transition is a low-to-high transition, the signal GLS_DLY being high enables the gate AND1 to output the signal DEAD_LH corresponding to the delay 137 in FIG. 1B.

The gate AND2 has a first input A coupled to the output 215 of the buffer-invert-delay circuit 220 to receive the signal GHSinv, a second input B coupled to the output 216 of the buffer-invert-delay circuit 220 to receive the signal GLSbuf, a third input C coupled to the output 218 of the buffer-invert-delay circuit 220 to receive the signal GLS_DLY, and an output configured to output a signal SHOOT_LH. When the signal GLS_DLY is high, indicating that the current transition is a low-to-high transition, the signal GLS_DLY being high enables the gate AND2 to output the signal SHOOT_LH corresponding to a shoot-through condition of the first and second switches during the current low-to-high transition.

The gate AND3 has a first input A coupled to the output 214 of the signal pre-processing circuit 210 to receive the signal GHSbuf, a second input B coupled to the output 217 of the buffer-invert-delay circuit 220 to receive the signal GLSinv, a third input C coupled to the output 219 of the buffer-invert-delay circuit 220 to receive the signal GLS_DLYinv, and an output configured to output a signal DEAD_HL. When the signal GLS_DLYinv is high, indicating that the signal GLS_DLY is low and the current transition is a high-to-low transition, the signal GLS_DLYinv being high enables the gate AND3 to output the signal DEAD_HL corresponding to the delay 135 in FIG. 1B.

The gate AND4 has a first input A coupled to the output 215 of the buffer-invert-delay circuit 220 to receive the signal GHSinv, a second input B coupled to the second input 212 of the buffer-invert-delay circuit 220 to receive the signal GLS, a third input C coupled to the output 219 of the buffer-invert-delay circuit 220 to receive the signal GLS_DLYinv, and an output configured to output a signal SHOOT_HL. When the signal GLS_DLYinv is high, indicating that the signal GLS_DLY is low and the current transition is a high-to-low transition, the signal GLS_DLYinv being high enables the gate AND4 to output the signal SHOOT_HL corresponding to a shoot-through condition of the first and second switches during the current high-to-low transition. The described configuration using AND gates for generating the signals DEAD_LH, SHOOT_LH, DEAD_HL, and SHOOT_HL is an example. Other configurations for generating the signals DEAD_LH, SHOOT_LH, DEAD_HL, and SHOOT_HL are within the scope of various embodiments.

As discussed herein, the signals DEAD_LH, SHOOT_LH, DEAD_HL, and SHOOT_HL outputted from the gates AND1-AND4 correspond to dead-time and shoot-through conditions to be detected by the delay controlling circuit 200. However, the pulse widths of the signals DEAD_LH, SHOOT_LH, DEAD_HL, and SHOOT_HL in some situations are so small (or narrow) that if the signals DEAD_LH, SHOOT_LH, DEAD_HL, and SHOOT_HL are directly supplied to the subsequent logic circuit, e.g., the delay adjustment determining circuit 240, then logic elements in the subsequent logic circuit potentially do not have sufficient time to respond to such narrow pulses, which will be likely loss, resulting in reduced performance and/or accuracy of the delay controlling circuit 200. To address this potential issue, the delay controlling circuit 200 in one or more embodiments includes the pulse sharper-widener circuit 230.

The pulse sharper-widener circuit 230 includes inputs 231-234 and outputs 235-238. The inputs 231-234 are coupled to the outputs of the corresponding gates AND1-AND4 to receive the corresponding signals DEAD_LH, SHOOT_LH, DEAD_HL, and SHOOT_HL. The pulse sharper-widener circuit 230 is configured to widen the received signals DEAD_LH, SHOOT_LH, DEAD_HL, and SHOOT_HL and output the widened pulses, as the corresponding first dead-time signal DEADLH_WIDE, first shoot-through signal SHOOTLH_WIDE, second dead-time signal DEADHL_WIDE, and second shoot-through signal SHOOTHL_WIDE, to the delay adjustment determining circuit 240. The widened pulses provided by the pulse sharper-widener circuit 230 reduce the likelihood that logic elements in the delay adjustment determining circuit 240 do not have sufficient time to detect existing dead-time to shoot-through conditions, increasing sensitivity and/or accuracy of the delay controlling circuit 200.

Figure 4A:
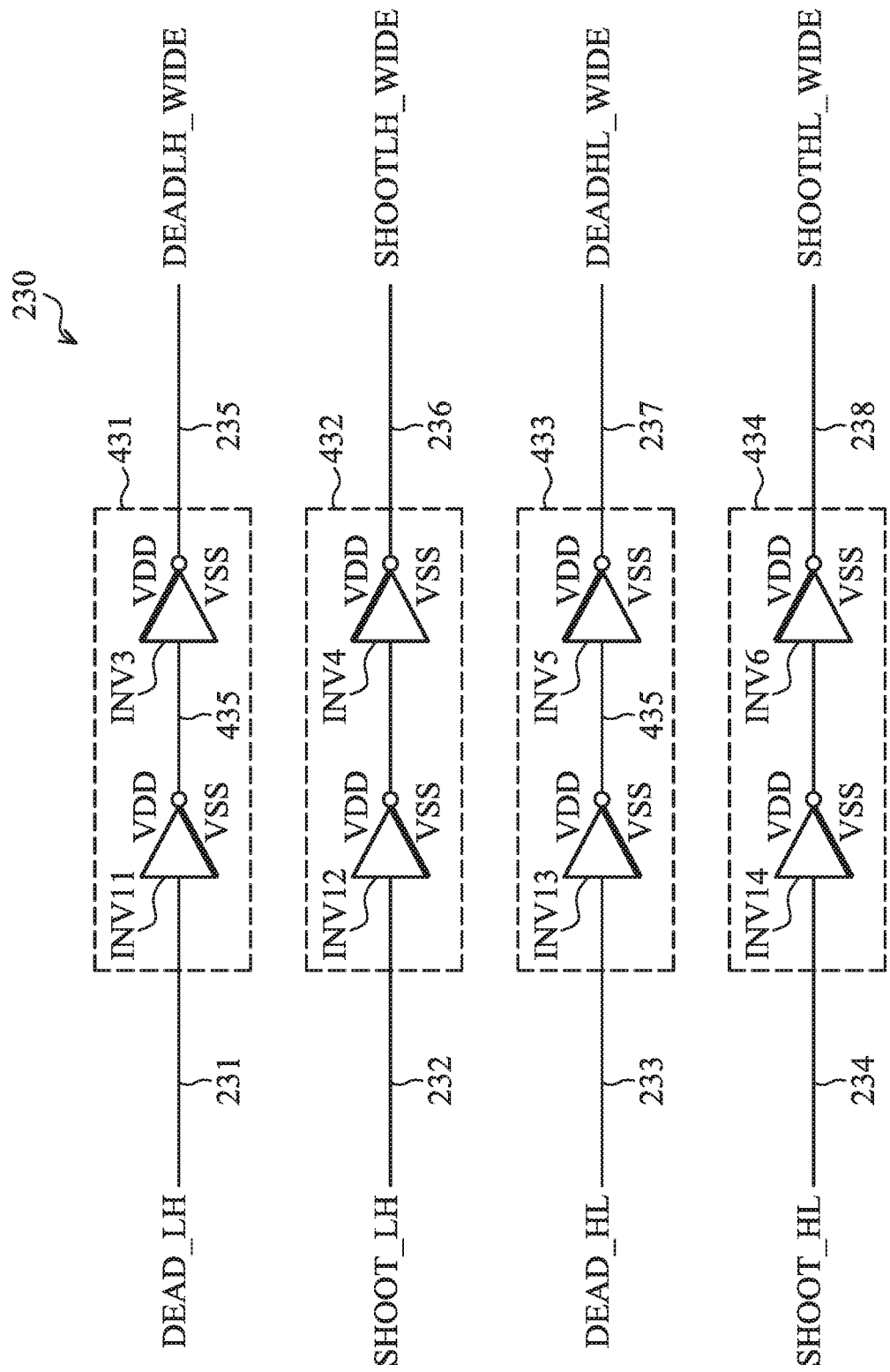
FIG. 4A is a schematic circuit diagram of a circuit in a delay controlling circuit in accordance with some embodiments.

FIG. 4A is a schematic circuit diagram of the pulse sharper-widener circuit 230 in accordance with some embodiments. The pulse sharper-widener circuit 230 includes at least one cascade of asymmetric inverters. For example, the pulse sharper-widener circuit 230 in FIG. 4A includes four cascades 431-434 of asymmetric inverters. Each of the cascades includes a first asymmetric inverter coupled in series with a second asymmetric inverter. For example, the cascades 431-434 include corresponding first asymmetric inverters INV11-INV14 and corresponding second asymmetric inverters INV3-INV6. Inputs of the first asymmetric inverters INV11-INV14 are coupled to the corresponding inputs 231-234 of the pulse sharper-widener circuit 230. Outputs of the first asymmetric inverters INV11-INV14 are coupled to inputs of the corresponding second asymmetric inverters INV3-INV6. Outputs of the second asymmetric inverters INV3-INV6 are coupled to the corresponding outputs 235-238 of the pulse sharper-widener circuit 230.

Each of the first asymmetric inverters INV11-INV14 includes a high side driver weaker than a low side driver. In one or more embodiments, the high side driver includes a PMOS transistor and the low side driver includes an NMOS transistor stronger than the NMOS transistor. Each of the second asymmetric inverters INV3-INV6 includes a high side driver stronger than a low side driver. In one or more embodiments, the high side driver includes a PMOS transistor and the low side driver includes an NMOS transistor weaker than the NMOS transistor. Other asymmetric inverter configurations are within the scope of various embodiments.

Figure 4B:
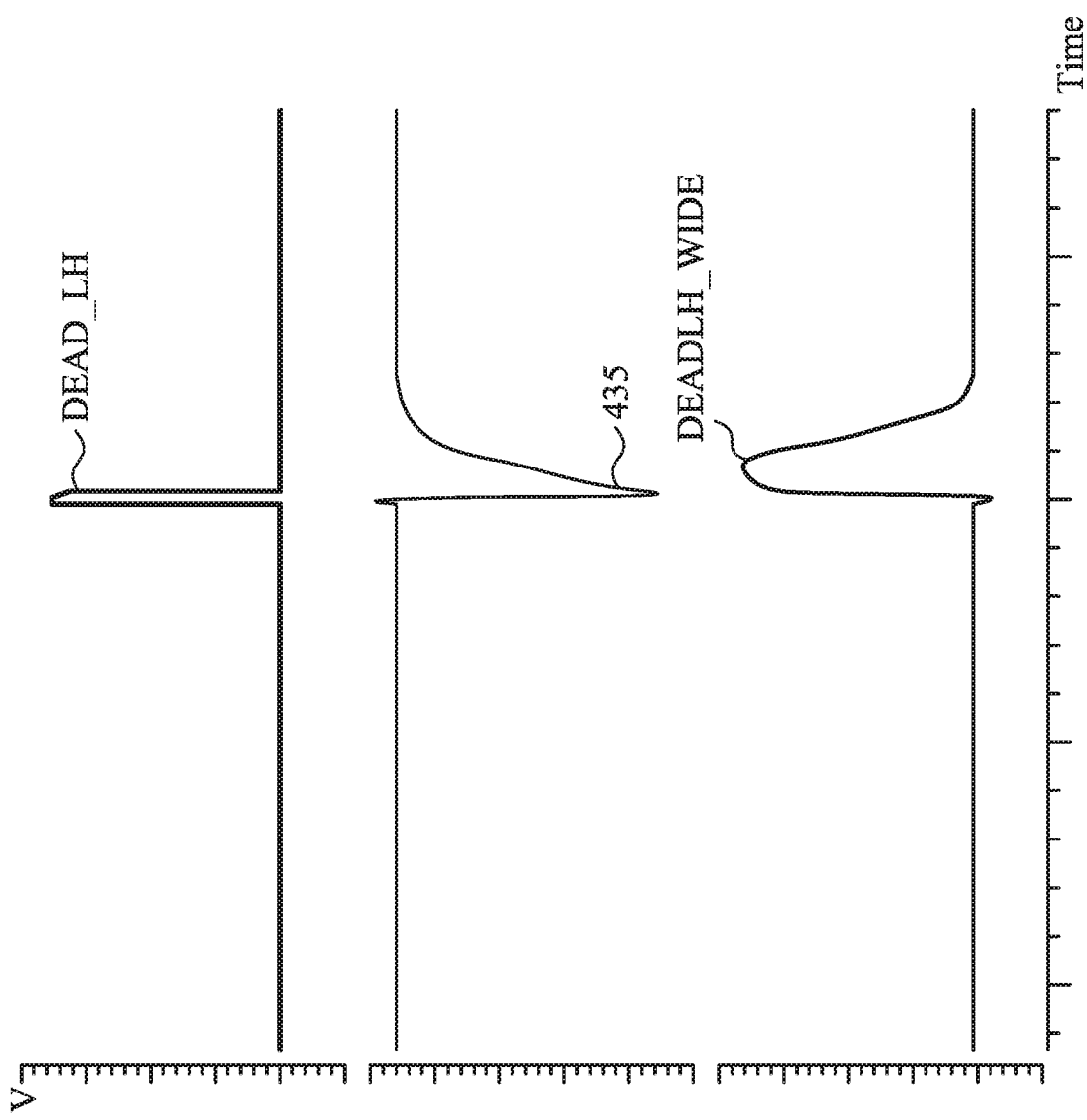
FIG. 4B is a timing diagram of an operation of a circuit in a delay controlling circuit in accordance with some embodiments.

FIG. 4B is a timing diagram of an operation of the cascade 431 in FIG. 4A. The other cascades 432-434 operate in a similar manner. As illustrated in FIG. 4B, the signal DEAD_LH has a narrow pulse width. In an example configuration, the pulse width of the signal DEAD_LH is about 30 ps. The first asymmetric inverter INV11 inverts and increases the pulse width of the inputted signal DEAD_LH to output an intermediate signal at the output 435 of the first asymmetric inverter INV11. As illustrated in FIG. 4B, the intermediate signal 435 is wider than the signal DEAD_LH. In an example configuration, the pulse width of the intermediate signal 435 is about 130 ps. The second asymmetric inverter INV3 inverts and further increases the pulse width of the intermediate signal 435. As a result, the outputted first dead-time signal DEADLH_WIDE has the same polarity as the inputted signal DEAD_LH, but with a wider pulse width. In an example configuration, the pulse width of the first dead-time signal DEADLH_WIDE is about 250 ps which is about 8 times the pulse width of the signal DEAD_LH. As discussed herein, the widened pulse widths of the first dead-time signal DEADLH_WIDE, first shoot-through signal SHOOTLH_WIDE, second dead-time signal DEADHL_WIDE, and second shoot-through signal SHOOTHL_WIDE permit the delay controlling circuit 200 to detect dead-time and/or shoot-through conditions with increased accuracy and/or sensitivity. In at least one embodiment, the edges of one or more of the first dead-time signal DEADLH_WIDE, first shoot-through signal SHOOTLH_WIDE, second dead-time signal DEADHL_WIDE, and second shoot-through signal SHOOTHL_WIDE are sharpened by the corresponding asymmetric inverters which further improves performance of the delay controlling circuit 200. The described configuration and/or operation of the pulse sharper-widener circuit 230 is/are an example. Other configurations and/or operations for the pulse sharper-widener circuit 230 are within the scope of various embodiments.

Returning to FIG. 2A-2B, the delay adjustment determining circuit 240 includes a first latch SR1, a second latch SR2, a first logic circuit 241, and a second logic circuit 242. The first latch SR1 includes a first input RST (which is a reset input) coupled to the output 235 to receive the first dead-time signal DEADLH_WIDE, a second input SET (which is a set input) coupled to the output 236 to receive the first shoot-through signal SHOOTLH_WIDE, and an output Q configured to supply a signal UP_LH to the delay storing and adjusting circuit 250. The first logic circuit 241 includes first and second inputs coupled to the corresponding first and second inputs RST, SET of the first latch SR1, and an output configured to supply a signal PULSE_LH to the delay storing and adjusting circuit 250. In the specific configuration of FIG. 2A-2B, the first logic circuit 241 includes an OR gate OR1 and a delay element DLY10. The gate OR1 includes first and second inputs B, A defining the corresponding first and second inputs of the first logic circuit 241, and an output coupled to an input of the delay element DLY10. An output of the delay element DLY10 defines the output of the first logic circuit 241.

The second latch SR2 includes a first input RST (which is a reset input) coupled to the output 237 to receive the second dead-time signal DEADHL_WIDE, a second input SET (which is a set input) coupled to the output 238 to receive the second shoot-through signal SHOOTHL_WIDE, and an output Q configured to supply a signal UP_HL to the delay storing and adjusting circuit 250. The second logic circuit 242 includes first and second inputs coupled to the corresponding first and second inputs RST, SET of the second latch SR2, and an output configured to supply a signal PULSE_HL to the delay storing and adjusting circuit 250. In the specific configuration of FIG. 2A-2B, the second logic circuit 242 includes an OR gate OR2 and a delay element DLY20. The gate OR2 includes first and second inputs B, A defining the corresponding first and second inputs of the second logic circuit 242, and an output coupled to an input of the delay element DLY20. An output of the delay element DLY20 defines the output of the second logic circuit 242. The described configuration of the delay adjustment determining circuit 240 is an example. Other configurations for the delay adjustment determining circuit 240 are within the scope of various embodiments.

The delay storing and adjusting circuit 250 includes a first counter, i.e., Counter 1, and a second counter, i.e., Counter 2. Counter 1 and Counter 2 are up/down counters. The Counter 1 has a control input UP_DNz coupled to the output of the first latch SR1, a clock input CLK coupled to the output of the first logic circuit 241, and an output configured to output a first delay setting of the delay 137 corresponding to the low-to-high transition. The first delay setting includes a plurality of bits HS_DelayCtrl_bits outputted from corresponding outputs A_0, A_1, . . . A_N−1 of the Counter 1. The Counter 2 has a control input UP_DNz coupled to the output of the second latch SR2, a clock input CLK coupled to the output of the second logic circuit 242, and an output configured to output a second delay setting of the delay 135 corresponding to the high-to-low transition. The second delay setting includes a plurality of bits LS_DelayCtrl_bits outputted from corresponding outputs A_0, A_1, . . . A_N−1 of the Counter 2. The described configuration of the delay storing and adjusting circuit 250 is an example. Other configurations for the delay storing and adjusting circuit 250 are within the scope of various embodiments.

The delay controlling circuit 200 in accordance with some embodiments operates as follows. For a low-to-high transition in a current cycle, the previous ON state of the low side driver, i.e., the second switch 120, is recorded through the high level of the signal GLS_DLY. As a result, the gates AND1 and AND2 are enabled by the high level signal GLS_DLY, and the gates AND3 and AND4 are disabled by the low level signal GLS_DLYinv. The enabled gates AND1 and AND2 output corresponding signals DEAD_LH and SHOOT_LH which are widened by the pulse sharper-widener circuit 230 and outputted at corresponding first dead-time signal DEADLH_WIDE and first shoot-through signal SHOOTLH_WIDE. The first dead-time signal DEADLH_WIDE indicates a dead-time condition and the first shoot-through signal SHOOTLH_WIDE indicates a shoot-through condition of the first and second switches during the low-to-high transition in the current cycle. When the first dead-time signal DEADLH_WIDE is high, a presence of a dead-time condition is detected, and when the first dead-time signal DEADLH_WIDE is low, an absence of a dead-time condition is detected. When the first shoot-through signal SHOOTLH_WIDE is high, a presence of a shoot-through condition is detected, and when the first shoot-through signal SHOOTLH_WIDE is low, an absence of a shoot-through condition is detected.

In the presence of either a dead-time condition or a shoot-through condition, either first dead-time signal DEADLH_WIDE or the first shoot-through signal SHOOTLH_WIDE is high. As a result, the output of the gate OR1 is high, and a high-level pulse is supplied by the delay element DLY10 to the input CLK of the Counter 1. The high-level pulse at the input CLK of the Counter 1 indicates a determination by the delay adjustment determining circuit 240 that the first delay setting for the low-to-high transition is to be adjusted. How the first delay setting is to be adjusted, i.e., increased or decreased, is indicated by the first latch SR1.

For example, in the presence of a dead-time condition, the first dead-time signal DEADLH_WIDE is high, the input RST of the first latch SR1 is high, and the first latch SR1 switches the output Q to the low level. The low level signal UP-LH supplied from the output Q of the first latch SR1 to the UP_DNz input of the Counter 1 switches the Counter 1 to the count-down mode. When the high-level pulse is supplied by the delay element DLY10 to the input CLK of the Counter 1, the Counter 1 decrements its count by 1, and outputs the decremented count via the HS_DelayCtrl_bits representing the first delay setting to the delay controlling circuit 140. The delay controlling circuit 140 reduces the delay 137 corresponding to the low-to-high transition in the subsequent cycle. When the dead-time condition persists in the low-to-high transition of the subsequent cycle or cycles, the process repeats and the Counter 1 further decrements the first delay setting, 1 per cycle, and the delay controlling circuit 140 further reduces the delay 137 until the dead-time condition is no longer detected. In at least one embodiment, the delay provided by the delay element DLY10 is sufficient for the Counter 1 to perform the counting operation. In an example configuration, the delay provided by the delay element DLY10 is about 100 ps.

For another example, in the presence of a shoot-through condition, the first shoot-through signal SHOOTLH_WIDE is high, the input SET of the first latch SR1 is high, and the first latch SR1 switches the output Q to the high level. The high level signal UP-LH supplied from the output Q of the first latch SR1 to the UP_DNz input of the Counter 1 switches the Counter 1 to the count-up mode. When the high-level pulse is supplied by the delay element DLY10 to the input CLK of the Counter 1, the Counter 1 increments its count by 1, and outputs the incremented count via the HS_DelayCtrl_bits representing the first delay setting to the delay controlling circuit 140. The delay controlling circuit 140 increases the delay 137 corresponding to the low-to-high transition in the subsequent cycle. When the dead-time condition persists in the high-to-low transition of the subsequent cycle or cycles, the process repeats and the Counter 1 further increments the first delay setting, 1 per cycle, and the delay controlling circuit 140 further increases the delay 137 until the shoot-through condition is no longer detected.

In the absence of both a dead-time condition and a shoot-through condition, both first dead-time signal DEADLH_WIDE and the first shoot-through signal SHOOTLH_WIDE are low. As a result, the output of the gate OR1 is low, and a low-level pulse is supplied by the delay element DLY10 to the input CLK of the Counter 1. The low-level pulse at the input CLK of the Counter 1 indicates a determination by the delay adjustment determining circuit 240 that the first delay setting for the low-to-high transition is not to be adjusted. The Counter 1 outputs the current count stored in the Counter 1 to the delay controlling circuit 140. The delay controlling circuit 140 maintains the delay 137 corresponding to the low-to-high transition unchanged in the subsequent cycle.

The gates AND1-AND2, the corresponding pulse widening circuits in the pulse sharper-widener circuit 230, the first latch SR1, the first logic circuit 241 and the Counter 1 together define a first circuit configured to control the first delay setting for the delay 137 at a low-to-high transition. The gates AND3-AND4, the corresponding pulse widening circuits in the pulse sharper-widener circuit 230, the second latch SR2, the second logic circuit 242 and the Counter 2 together define a second circuit configured to control the second delay setting for the delay 135 at a high-to-low transition. The second circuit operates similarly to the first circuit, in one or more embodiments. In some embodiments, the first circuit is configured to operate independently of the second circuit to control the first delay setting for the delay 137 independently of the second delay setting for the delay 135.

Figure 5:
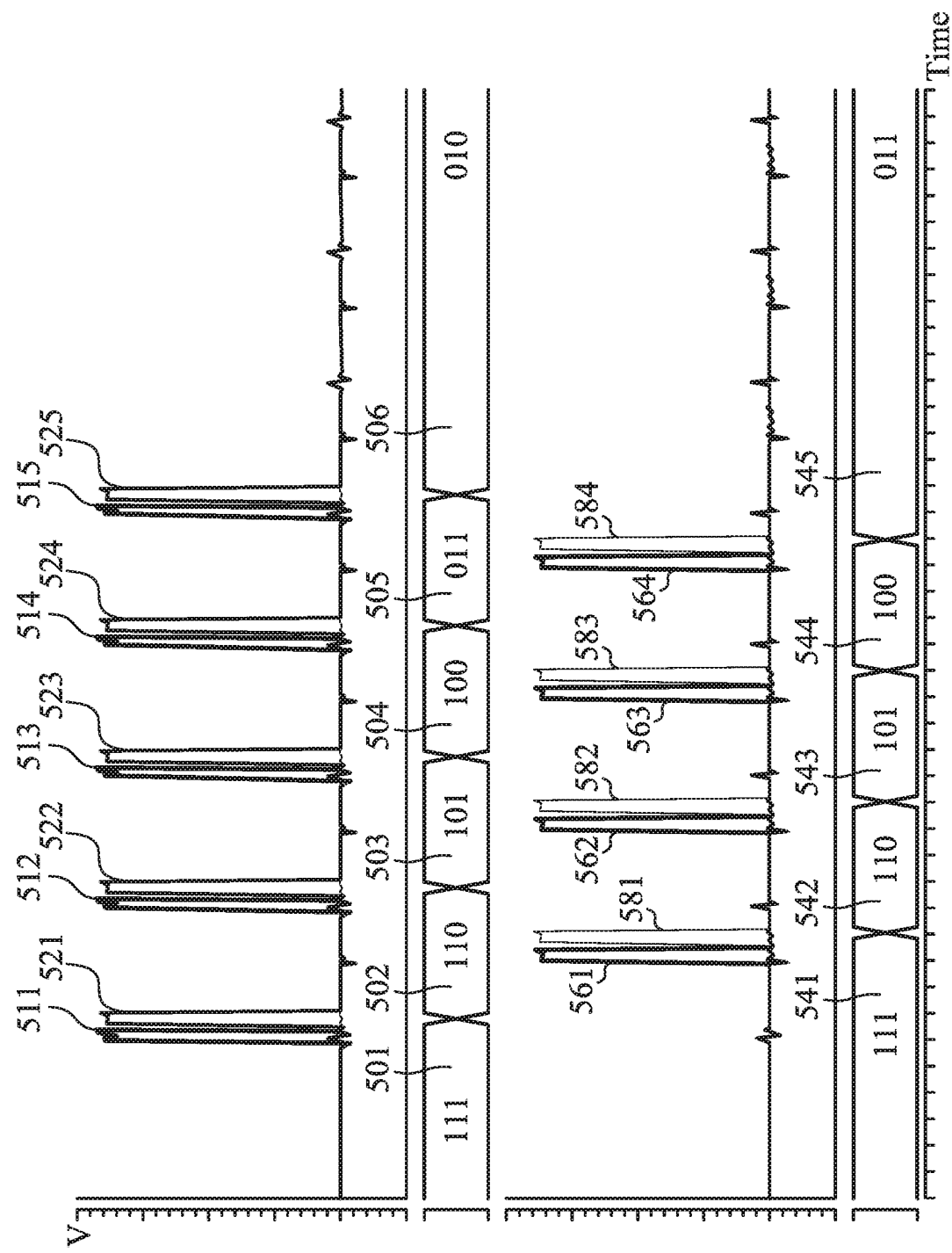
FIG. 5 is a timing diagram of an operation of a delay controlling circuit in accordance with some embodiments.

FIG. 5 is a timing diagram of an operation of the delay controlling circuit 200 in accordance with some embodiments. The Counter 1 is initially set at the maximum count of "7" corresponding to the binary code of "111" as indicated at 501. The maximum count of "7" is outputted as the delay setting to the delay controlling circuit 140 which generates the corresponding maximum delay 137 at a low-to-high transition. The maximum delay 137 causes the delay controlling circuit 200 to detect a dead-time condition represented by the first dead-time signal DEADLH_WIDE 511 which causes a corresponding signal 521 on the input CLK of the Counter 1. As a result the Counter 1 adjusts its count, by counting down 1, to "6" corresponding to the binary code of "110" as indicated at 502. The adjusted count is outputted as the delay setting to the delay controlling circuit 140 which reduces the delay 137 at a low-to-high transition in the next cycle. The process repeats with the Counter 1 counting down 1 per cycle as indicated at 503-506, resulting in first dead-time signals DEADLH_WIDE 512-515 and corresponding signals 522-525 on the input CLK of the Counter 1. The pulse widths of the first dead-time signals DEADLH_WIDE 511-515 are decreased as the Counter 1 counts down. When the Counter 1 reaches a count of "2" corresponding to the binary code "010," the first dead-time signal DEADLH_WIDE disappears, indicating that the dead-time condition is no longer detected. The count of "2," or the delay setting of the delay 137 on the low-to-high transition, in maintained by the delay controlling circuit 200 in the subsequent cycles.

The delay setting of the delay 135 on the high-to-low transition is controlled in a manner similar to, and independently of, the described control of the delay setting of the delay 137. For example, the Counter 2 is initially set at the maximum count of "7" corresponding to the binary code of "111" as indicated at 501. The maximum count of "7" causes a dead-time condition represented by a second dead-time signal DEADHL_WIDE 561 and a corresponding signal 581 on the input CLK of the Counter 2. Counter 2 counts down, 1 per cycle, as indicated at 542-545, resulting in second dead-time signals DEADHL_WIDE 562-564 and corresponding signals 582-584 on the input CLK of the Counter 2. The pulse widths of the second dead-time signals DEADHL_WIDE 561-564 are decreased as the Counter 2 counts down. When the Counter 2 reaches a count of "3" corresponding to the binary code "011," the dead-time condition is no longer detected. The count of "3," or the delay setting of the delay 135 on the high-to-low transition, in maintained by the delay controlling circuit 200 in the subsequent cycles. The described operation is an example. Other operational arrangements are within the scope of various embodiments.

Figure 6A:
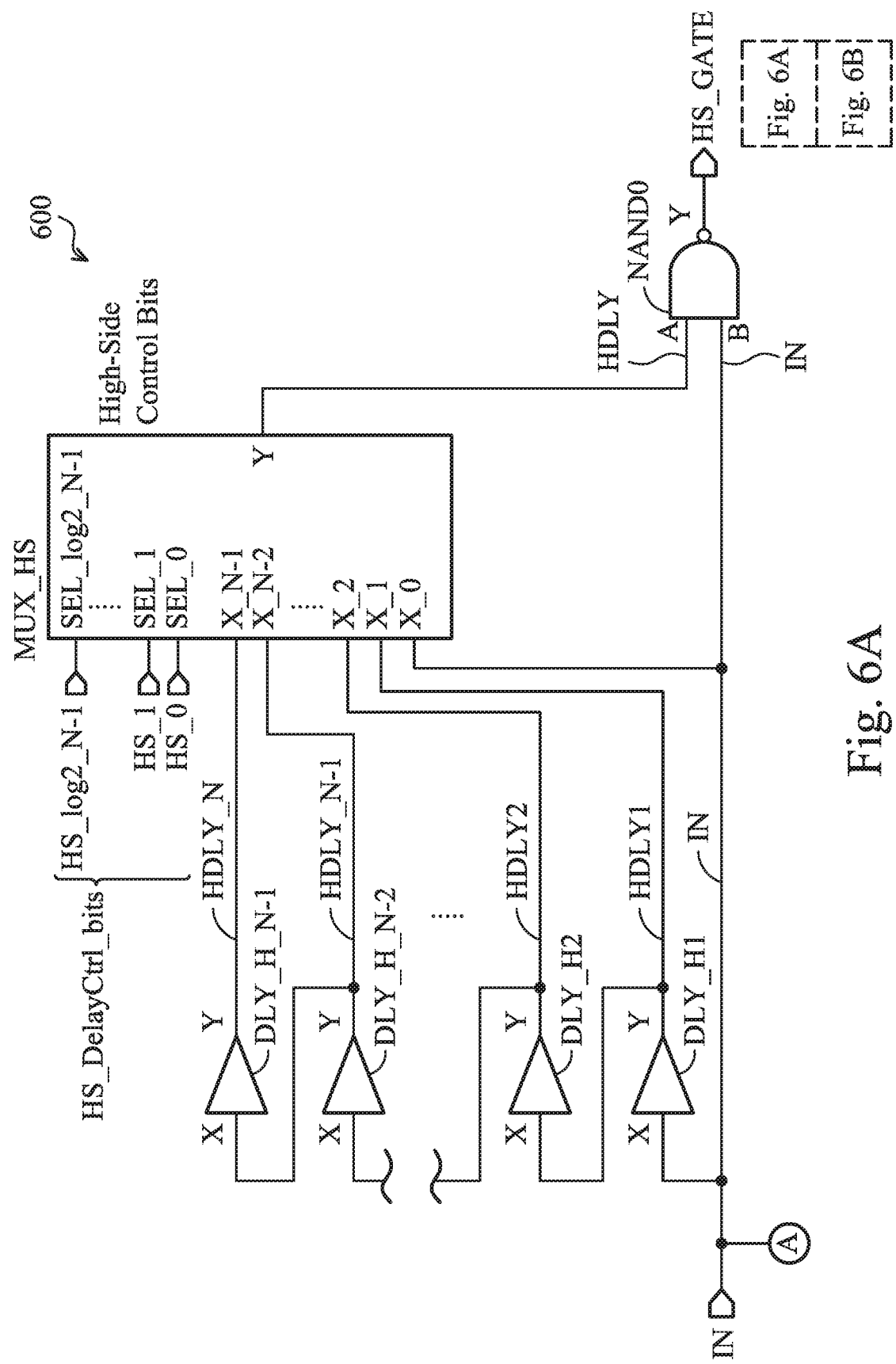
FIG. 6A-6B is a schematic circuit diagram of a delay generating circuit in accordance with some embodiments.
Figure 6B:
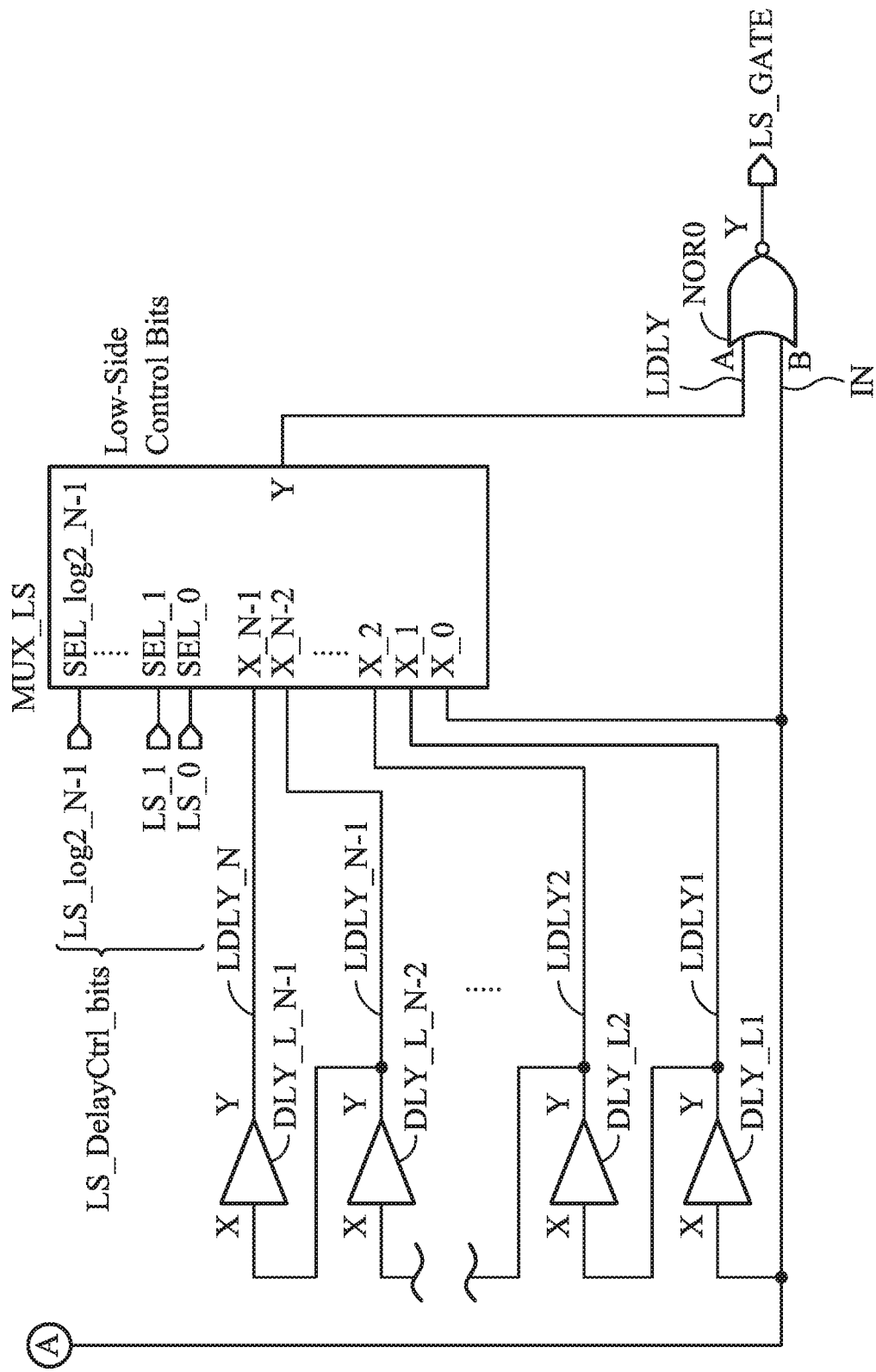

FIG. 6A-6B is a schematic circuit diagram of a delay generating circuit 600 in accordance with some embodiments. In some embodiments, the delay generating circuit 600 corresponds to the delay controlling circuit 140 in the driving circuit 100 described with respect to FIG. 1A. The delay generating circuit 600 includes a first part for controlling the delay 137 and a second part for controlling the delay 135. In the first part for controlling the delay 137, the delay generating circuit 600 includes a cascade of first delay elements DLY_H1, DLY_H2, . . . , DLY_H_N−2 and DLY_H_N−1, coupled in series and configured to output signals HDLY1, HDLY2, . . . , DLY_N−1 and DLY_N, which are increasingly delayed signals of the input signal IN. The delayed signals HDLY1, HDLY2, . . . , DLY_N−1 and DLY_N are inputted to corresponding inputs X_0 to X_N−1 of a multiplexer MUX_HS. The multiplexer MUX_HS further has inputs SEL_0 to SEL_log 2_N−1 coupled to the delay controlling circuit 140 to receive the HS_DelayCtrl_bits for controlling the delay 137 at the low-to-high transition. An output Y of the multiplexer MUX_LS and the input signal IN are coupled to inputs of a NAND gate NAND0. The output of the gate NAND0 is coupled to the output HS_GATE for supplying the first voltage GHS to the first control terminal HS of the first switch 110.

The HS_DelayCtrl_bits represent a binary code which indicates which of the delayed signals HDLY1, HDLY-2, . . . , DLY_N−1 and DLY_N is outputted at the output Y of the multiplexer MUX_HS. For example, when the HS_DelayCtrl_bits represent a binary code "010" (decimal "2") the corresponding delayed signal HDLY2 is outputted by the multiplexer MUX_HS and combined with the input signal IN by the gate NAND0 to output the first voltage GHS at the output HS_GATE. When the HS_DelayCtrl_bits represent a reduced binary code "001" (decimal "1") due to an adjustment by the delay controlling circuit 140, another corresponding delayed signal HDLY1 is outputted by the multiplexer MUX_HS and combined with the input signal IN by the gate NAND0 to output the first voltage GHS at the output HS_GATE with a decreased delay 137.

In the second part for controlling the delay 135, the delay generating circuit 600 includes a cascade of second delay elements DLY_H1, DLY_H2, . . . , DLY_H_N−2 and DLY_H_N−1, coupled in series and configured to output signals LDLY1, LDLY2, . . . , LDLY_N−1 and LDLY_N to corresponding inputs X_0 to X_N−1 of a multiplexer MUX_LS. The multiplexer MUX_LS further has inputs SEL_0 to SEL_log 2_N−1 coupled to the delay controlling circuit 140 to receive the LS_DelayCtrl_bits for controlling the delay 135 at the high-to-low transition. An output Y of the multiplexer MUX_LS and the input signal IN are coupled to inputs of a NOR gate NOR0. The output of the gate NOR0 is coupled to the output LS_GATE for supplying the second voltage GLS to the second control terminal LS of the second switch 120. Operations of the second part for controlling the delay 135 is similar to operations of the first part for controlling the delay 137. The described configurations and/or operation of the delay generating circuit 130 is an example. Other configurations and/or operation for the delay generating circuit 130 are within the scope of various embodiments.

Figure 7:
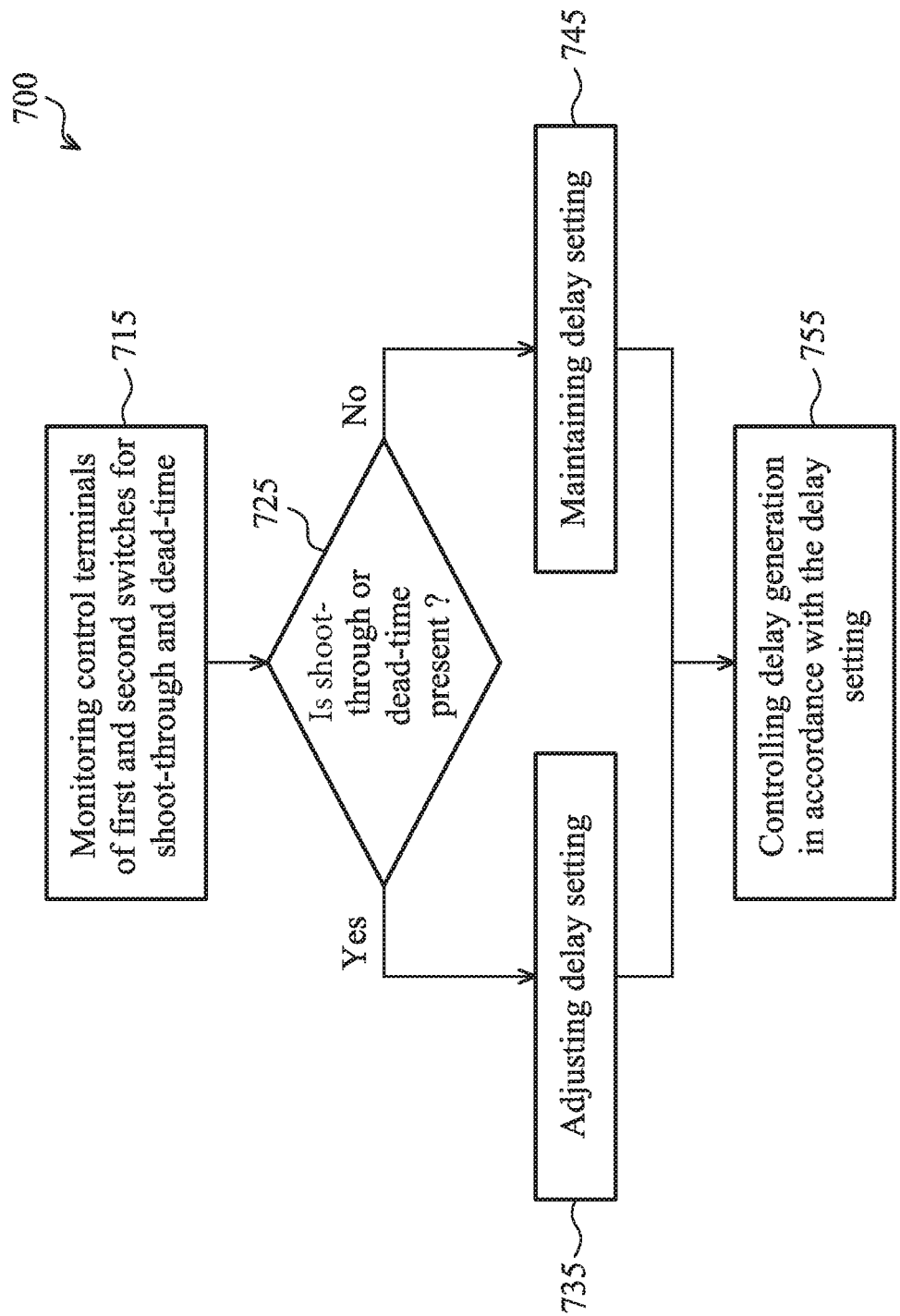
FIG. 7 is a flow chart of a method of operating a driving circuit in accordance with some embodiments.

FIG. 7 is a flow chart of a method 700 of operating a driving circuit in accordance with some embodiments. In at least one embodiment, the method 700 is performed by the delay controlling circuit 140 or the delay controlling circuit 200 described herein.

At operation 715, first and second voltages on control terminals of corresponding first and second switches are monitored for a shoot-through condition and a dead-time condition. For example, the first voltage GHS and the second voltage GLS are used by the signal pre-processing circuit 210 to generate the first dead-time signal DEADLH_WIDE, first shoot-through signal SHOOTLH_WIDE, second dead-time signal DEADHL_WIDE and second shoot-through signal SHOOTHL_WIDE corresponding to dead-time and shoot-through conditions, as described herein.

At operation 725, it is determined if a dead-time condition or a shoot-through condition is present. For example, the first dead-time signal DEADLH_WIDE, first shoot-through signal SHOOTLH_WIDE, second dead-time signal DEAD- HL_WIDE and second shoot-through signal SHOOT-HL_WIDE are supplied to the delay adjustment determining circuit 240 for a determination whether a dead-time condition and/or a shoot-through condition is/are present, as described herein.

At operation 735, in response to a determination that a dead-time condition or a shoot-through condition is present, the delay setting for the corresponding low-to-high transition or high-to-low transition is adjusted. For example, when the first dead-time signal DEADLH_WIDE has a high level corresponding to a presence of a dead-time condition, the delay setting of the corresponding delay 137 is adjusted to decrease the delay 137, as described herein.

At operation 745, in response to a determination that no dead-time condition and no shoot-through condition are present, the delay setting for the corresponding low-to-high transition or high-to-low transition is maintained. For example, when both the first dead-time signal DEADLH_WIDE and the first shoot-through signal SHOOT-LH_WIDE have a low level, the delay setting of the corresponding delay 137 is unchanged, as described herein.

At operation 755, the corresponding delay is generated in accordance with the delay setting. For example, when the delay setting is adjusted at operation 735, the adjusted delay setting is outputted to the delay generating circuit 130 to insert an adjusted delay into the corresponding first voltage GHS or second voltage GLS, as described herein. When the delay setting is maintained at operation 745, the maintained delay setting is outputted to the delay generating circuit 130 to insert the same delay as in the previous cycle into the corresponding first voltage GHS or second voltage GLS of the current cycle, as described herein.

In some embodiments, the first voltage GHS and the second voltage GLS are monitored in operation 715 without considering any signal from the output node OUT and/or from external circuitry on the load side of the driving circuit.

The above method embodiment shows example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing various embodiments.

Some embodiments provide a delay controlling circuit for dead-time optimization in a driving circuit, by monitoring the control terminals of the high side and low side switches of the driving circuit, without using a feedback circuit or signal from the output node between the switches and/or from external circuitry on the load side. As a result, the delay controlling circuit in accordance with some embodiments achieves an improved response time, without being influenced by negative effects from the load side and/or by the current direction at the output node OUT. Some embodiments provide a delay controlling circuit configured to improve signal quality and widen the signal pulse width. As a result, sensitivity and/or accuracy of the delay controlling circuit in accordance with some embodiments is/are improved which, in turn, permits the delay controlling circuit to operate in driving circuits with very high switching speed, e.g., about 200 MHz. Some embodiments provide a delay controlling circuit with both delay adjustability and stability where an optimal delay, when reached, is kept unchanged unless a dead-time condition or a shoot-through condition is detected.

In some embodiments, a circuit includes a first switch and a second switch, a first circuit and a second circuit. The first switch includes a first terminal, and the second switch includes a second terminal. The first circuit is coupled to the first terminal and the second terminal. The first circuit is configured to alternately turn ON the first switch and the second switch in accordance with an input signal and a delay setting. The delay setting corresponding to a delay between successive ON times of the first switch and the second switch. The second circuit is coupled to the first circuit. The second circuit is configured to monitor a first voltage on the first terminal and a second voltage on the second terminal, and to generate the delay setting based on at least the first voltage on the first terminal, or the second voltage on the second terminal.

In some embodiments, a circuit includes a first circuit, a second circuit and a third circuit. The first circuit is configured to generate a first dead-time signal and a first shoot-through signal from both a first voltage and a second voltage. The first circuit includes first and second inputs configured to receive the corresponding first and second voltages, and being coupled to corresponding first and second switches. The first and second switches are configured to be alternately turned ON in accordance with corresponding first and second states of an input signal. The first circuit further includes a first output configured to output the first dead-time signal corresponding to a dead-time condition of the first switch and the second switch upon a first transition of the input signal from the first state to the second state. The first circuit further includes a second output configured to output the first shoot-through signal corresponding to a shoot-through condition of the first switch and the second switch upon the first transition. The second circuit is coupled to the first circuit, and is configured to receive the first dead-time signal and the first shoot-through signal, and to output a control signal. The third circuit is coupled to the second circuit, and is configured to receive the control signal, and to output at least a first setting of a first delay between an ON time of the first switch and a successive ON time of the second switch upon the first transition.

The first circuit including first and second inputs configured to be coupled to corresponding first and second switches; a first output configured to output a first dead-time signal corresponding to a dead-time condition of the first switch and the second switch upon a first transition of the input signal from the first state to the second state; and a second output configured to output a first shoot-through signal corresponding to a shoot-through condition of the first switch and the second switch upon the first transition. The first and second switches are configured to be alternately turned ON in accordance with corresponding first and second states of an input signal. The first latch including a first input coupled to the first output of the first circuit; a second input coupled to the second output of the first circuit; and an output. The first counter including a control input coupled to the output of the first latch; and an output configured to output a first setting of a first delay between an ON time of the first switch and a successive ON time of the second switch upon the first transition.

In some embodiments, a method of operating a circuit including first and second switches. The method comprises monitoring the first and second switches for a dead-time condition and a shoot-through condition of the first and second switches in a first cycle of an input signal; and maintaining a setting of a delay between successive ON times of the first switch and the second switch in a second cycle of the input signal, if the dead-time condition and the shoot-through condition are not present in the first cycle of the input signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
  a first switch and a second switch, the first switch including a first terminal, and the second switch including a second terminal;
  a first circuit coupled to the first terminal and the second terminal, the first circuit configured to alternately turn ON the first switch and the second switch in accordance with an input signal and a delay setting, the delay setting corresponding to a delay between successive ON times of the first switch and the second switch; and
  a second circuit coupled to the first circuit, and being configured to:
    monitor a first voltage on the first terminal and a second voltage on the second terminal, and
    generate the delay setting based on at least the first voltage on the first terminal, or the second voltage on the second terminal.

2. The circuit of claim 1, wherein the second circuit comprises:
  a signal pre-processing circuit configured to generate, from the first voltage and the second voltage,
    a first shoot-through signal corresponding to a shoot-through condition of the first switch and the second switch upon a first transition of the input signal from a first state to a second state,
    a second shoot-through signal corresponding to the shoot-through condition of the first switch and the second switch upon a second transition of the input signal from the second state to the first state,
    a first dead-time signal corresponding to a dead-time condition of the first switch and the second switch upon the first transition of the input signal, and
    a second dead-time signal corresponding to the dead-time condition of the first switch and the second switch upon the second transition of the input signal.

3. The circuit of claim 2, wherein the second circuit further comprises:
  a delay adjustment determining circuit coupled to the signal pre-processing circuit, and configured to generate
    a first delay adjustment signal responsive to the first dead-time signal or the first shoot-through signal, the first delay adjustment signal indicating whether to adjust a first setting of the delay setting, the first setting corresponding to a first delay to be generated by the first circuit between an ON time of the first switch and a successive ON time of the second switch upon the first transition, and
    a second delay adjustment signal responsive to the second dead-time signal or the second shoot-through signal, the second delay adjustment signal indicating whether to adjust a second setting of the delay setting, the second setting corresponding to a second delay to be generated by the first circuit between an ON time of the second switch and a successive ON time of the first switch upon the second transition.

4. The circuit of claim 3, wherein the second circuit further comprises:
  a delay storing and adjusting circuit coupled to the delay adjustment determining circuit, and configured to
    store the first setting and the second setting,
    adjust the first setting in response to a first level of the first delay adjustment signal, and keep the first setting unchanged in response to a second level of the first delay adjustment signal, and
    adjust the second setting in response to a first level of the second delay adjustment signal, and keep the second setting unchanged in response to a second level of the second delay adjustment signal.

5. The circuit of claim 3, wherein
  the signal pre-processing circuit is further configured to widen pulse widths of the first shoot-through signal, the second shoot-through signal, the first dead-time signal, and the second dead-time signal before outputting to the second circuit.

6. The circuit of claim 1, wherein the second circuit is further configured to:
  determine whether to adjust the delay setting in accordance with the first voltage and the second voltage,
  keep the delay setting unchanged in response to a first determination to not adjust the delay setting, and
  adjust the delay setting in response to a second determination to adjust the delay setting.

7. The circuit of claim 6, wherein
  the first determination indicates a no dead-time condition and a no shoot-through condition of the first switch and the second switch, and
  the second determination indicates a dead-time condition or a shoot-through condition of the first switch and the second switch.

8. The circuit of claim 1, wherein the second circuit comprises:
  a first sub-circuit configured to control the first circuit to generate a first delay between an ON time of the first switch and a successive ON time of the second switch, in response to a first transition of the input signal from a first state to a second state; and
  a second sub-circuit configured to control the first circuit to generate a second delay between an ON time of the second switch and a successive ON time of the first switch, in response to a second transition of the input signal from the second state to the first state;
  the first sub-circuit being configured to operate independent of the second sub-circuit, and to control the first delay independent of the second delay, and
  the second circuit being free of direct electrical connection from an output node between the first switch and the second switch.

9. The circuit of claim 8, wherein
  the delay setting includes a first delay setting of the first delay and a second delay setting of the second delay,
  the first sub-circuit is further configured to
    store the first delay setting, and
    control the first circuit to generate the first delay in accordance with the stored first delay setting, the first voltage and the second voltage, and the second sub-circuit is further configured to
store the second delay setting, and
control the first circuit to generate the second delay in accordance with the stored second delay setting, the first voltage and the second voltage.

10. A circuit, comprising:
a first circuit configured to generate a first dead-time signal and a first shoot-through signal from both a first voltage and a second voltage, the first circuit comprising:
first and second inputs configured to receive the corresponding first and second voltages, and being coupled to corresponding first and second switches, the first and second switches configured to be alternately turned ON in accordance with corresponding first and second states of an input signal;
a first output configured to output the first dead-time signal corresponding to a dead-time condition of the first switch and the second switch upon a first transition of the input signal from the first state to the second state; and
a second output configured to output the first shoot-through signal corresponding to a shoot-through condition of the first switch and the second switch upon the first transition;
a second circuit coupled to the first circuit, and being configured to receive the first dead-time signal and the first shoot-through signal, and to output a control signal; and
a third circuit coupled to the second circuit, and being configured to receive the control signal, and to output at least a first setting of a first delay between an ON time of the first switch and a successive ON time of the second switch upon the first transition.

11. The circuit of claim 10, wherein
the first circuit is further configured to generate a second dead-time signal and a second shoot-through signal from both a first voltage and a second voltage, and
the first circuit further comprises:
a third output configured to output the second dead-time signal corresponding to the dead-time condition of the first switch and the second switch upon a second transition of the input signal from the second state to the first state, and
a fourth output configured to output the second shoot-through signal corresponding to the shoot-through condition of the first switch and the second switch upon the second transition.

12. The circuit of claim 11, wherein the second circuit further comprises:
a first latch comprising:
a first input coupled to the first output of the first circuit,
a second input coupled to the second output of the first circuit, and
an output; and
a second latch comprising:
a first input coupled to the third output of the first circuit,
a second input coupled to the fourth output of the first circuit, and
an output.

13. The circuit of claim 12, wherein the third circuit further comprises:
a first counter comprising:
a control input coupled to the output of the first latch, and
an output configured to output the first setting of the first delay between the ON time of the first switch and the successive ON time of the second switch upon the first transition; and
a second counter comprising:
a control input coupled to the output of the second latch, and
an output configured to output a second setting of a second delay between an ON time of the second switch and a successive ON time of the first switch upon the second transition.

14. The circuit of claim 13, wherein the first circuit further comprises:
a first non-inverting buffer comprising:
an input coupled to the first input of the first circuit, and
an output;
a first inverter comprising:
an input coupled to the first input of the first circuit, and
an output;
a second non-inverting buffer comprising:
an input coupled to the second input of the first circuit, and
an output;
a second inverter comprising:
an input coupled to the second input of the first circuit, and
an output;
a third non-inverting buffer comprising:
an input coupled to the second input of the first circuit, and
an output; and
a third inverter comprising:
an input coupled to the output of the third non-inverting buffer, and
an output.

15. The circuit of claim 14, wherein the first circuit further comprises:
a first AND gate comprising:
a first input coupled to the first input of the first circuit,
a second input coupled to the output of the second inverter,
a third input coupled to the output of the third non-inverting buffer, and
an output coupled to the first output of the first circuit;
a second AND gate comprising:
a first input coupled to the output of the first inverter,
a second input coupled to the output of the second non-inverting buffer,
a third input coupled to the output of the third non-inverting buffer, and
an output coupled to the second output of the first circuit;
a third AND gate comprising:
a first input coupled to the output of the first non-inverting buffer,
a second input coupled to the output of the second inverter,
a third input coupled to the output of the third inverter, and
an output coupled to the third output of the first circuit; and
a fourth AND gate comprising:
a first input coupled to the output of the first inverter,
a second input coupled to the second input of the first circuit,
a third input coupled to the output of the third inverter, and an output coupled to the fourth output of the first circuit.

16. The circuit of claim 15, further comprising:
a first logic circuit comprising:
  a first input coupled to the first input of the first latch,
  a second input coupled to the second input of the first latch, and
  an output;
a second logic circuit comprising:
  a first input coupled to the first input of the second latch,
  a second input coupled to the second input of the second latch, and
  an output;
wherein
  the first counter further comprises a clock input coupled to the output of the first logic circuit; and
  the second counter further comprises a clock input coupled to the output of the second logic circuit.

17. The circuit of claim 16, wherein
the first logic circuit comprises:
  a first OR gate comprising:
    first and second inputs defining the corresponding first and second inputs of the first logic circuit, and
    an output; and
  a first delay circuit comprising:
    an input coupled to the output of the first OR gate, and
    an output defining the output of the first logic circuit; and
the second logic circuit comprises:
  a second OR gate comprising:
    first and second inputs defining the corresponding first and second inputs of the second logic circuit, and
    an output; and
  a second delay circuit comprising:
    an input coupled to the output of the second OR gate, and
    an output defining the output of the second logic circuit.

18. The circuit of claim 11, wherein
the first circuit further comprises at least one cascade of asymmetric inverters coupled to corresponding at least one of the first output, the second output, the third output or the fourth output of the first circuit;
the at least one cascade of asymmetric inverters comprises:
  a first asymmetric inverter comprising a first n-channel metal-oxide semiconductor (NMOS) transistor and a first p-channel metal-oxide semiconductor (PMOS) transistor, the first NMOS transistor stronger than the first PMOS transistor, and
  a second asymmetric inverter comprising a second NMOS transistor and a second PMOS transistor, the second PMOS transistor stronger than the second NMOS transistor, the first and second asymmetric inverters being coupled in series.

19. A method of operating a circuit including first and second switches, the method comprising:
  monitoring the first and second switches for a dead-time condition and a shoot-through condition of the first and second switches in a first cycle of an input signal; and
  maintaining a setting of a delay between successive ON times of the first switch and the second switch in a second cycle of the input signal, if the dead-time condition and the shoot-through condition are not present in the first cycle of the input signal.

20. The method of claim 19, further comprising:
  adjusting the setting of the delay between successive ON times of the first switch and the second switch in the second cycle of the input signal, if the dead-time condition or the shoot-through condition is present,
  wherein the first switch is coupled to the second switch by an output node, and the monitoring is performed without considering signals from the output node.

* * * * *